(12) United States Patent
Wu et al.

(10) Patent No.: US 9,831,216 B2
(45) Date of Patent: Nov. 28, 2017

(54) CHIP PACKAGING MODULE

(71) Applicant: Shenzhen Goodix Technology Co., Ltd., Shenzhen (CN)

(72) Inventors: Baoquan Wu, Shenzhen (CN); Wei Long, Shenzhen (CN)

(73) Assignee: Shenzhen Goodix Technology Co., Ltd., Shenzhen (CN)

(*) Notice: Subject to any disclaimer, the term of this patent is extended or adjusted under 35 U.S.C. 154(b) by 0 days.

(21) Appl. No.: 15/372,392

(22) Filed: Dec. 7, 2016

(65) Prior Publication Data

US 2017/0092622 A1    Mar. 30, 2017

Related U.S. Application Data

(63) Continuation of application No. PCT/CN2014/088300, filed on Oct. 10, 2014.

(30) Foreign Application Priority Data

Aug. 20, 2014  (CN) .......................... 2014 1 0414557

(51) Int. Cl.
*H01L 25/065* (2006.01)
*H01L 23/48* (2006.01)
(Continued)

(52) U.S. Cl.
CPC .......... *H01L 25/0657* (2013.01); *H01L 23/13* (2013.01); *H01L 23/3128* (2013.01);
(Continued)

(58) Field of Classification Search
CPC ..... H01L 23/13; H01L 23/3128; H01L 24/97; H01L 25/0657; H01L 25/16;
(Continued)

(56) References Cited

U.S. PATENT DOCUMENTS

2010/0019338 A1   1/2010  Kwon et al.
2012/0018895 A1*  1/2012  Oganesian ............ H01L 23/481
                                                        257/773

FOREIGN PATENT DOCUMENTS

CN        1893565 A    1/2007
CN      101207101 A    6/2008
(Continued)

OTHER PUBLICATIONS

International Search Report for International Application No. PCT/CN2014/088300, dated Apr. 1, 2015, 6 pages.
(Continued)

*Primary Examiner* — Ermias Woldegeorgis

(57) ABSTRACT

The present disclosure discloses a chip packaging module, including: a first chip, where a first pad is disposed on a side neighboring to a front surface of the first chip; at least a second chip, where at least one second chip is disposed on a rear side of the first chip, each second chip has a second pad, and wherein the first pad of the first chip is connected to the second pad of the second chip via a redistribution layer. According to the chip packaging module in the present disclosure, a second chip is disposed on a rear side of a first chip, and a first pad is connected to a second pad via a redistribution layer. By means of a redistribution technology on surfaces of multiple chips, a lead of a pad on a front surface of a fingerprint recognition chip is masterly winded to the back for interconnection, so that an induction area on the front surface of the chip can fully contact with a human body. In addition, the multi-chip redistribution technology can also greatly narrow down an interconnection distance between chips, which improves efficiency of communication between chips.

9 Claims, 3 Drawing Sheets

(51) Int. Cl.
*H01L 23/13* (2006.01)
*H01L 23/31* (2006.01)
*G06K 9/00* (2006.01)
*H01L 23/00* (2006.01)
*H01L 25/11* (2006.01)
*H01L 25/07* (2006.01)
*H01L 25/10* (2006.01)
*H01L 25/16* (2006.01)

(52) U.S. Cl.
CPC .......... *H01L 23/481* (2013.01); *G06K 9/0002* (2013.01); *H01L 24/94* (2013.01); *H01L 24/97* (2013.01); *H01L 25/0655* (2013.01); *H01L 25/071* (2013.01); *H01L 25/105* (2013.01); *H01L 25/112* (2013.01); *H01L 25/16* (2013.01); *H01L 2225/06524* (2013.01); *H01L 2225/06541* (2013.01); *H01L 2225/06555* (2013.01)

(58) Field of Classification Search
CPC ............... H01L 25/0655; H01L 25/105; H01L 25/0652; H01L 25/071; H01L 25/112; H01L 24/94
See application file for complete search history.

(56) References Cited

FOREIGN PATENT DOCUMENTS

| | | |
|---|---|---|
| CN | 101578703 A | 11/2009 |
| CN | 102244047 A | 11/2011 |
| CN | 102881666 A | 1/2013 |
| CN | 103337486 A | 10/2013 |
| CN | 102723306 A | 4/2014 |
| CN | 103887279 A | 6/2014 |
| JP | 2008235478 A | 10/2008 |

OTHER PUBLICATIONS

Office Action for CN Application No. 201410414557.X, dated Sep. 1, 2016, 7 pages.

\* cited by examiner

CHIP PACKAGING MODULE

CROSS-REFERENCE TO RELATED APPLICATIONS

The present application is a continuation of international application No. PCT/CN2014/088300, filed on Oct. 10, 2014, which claims priority to Chinese Patent Application No. CN201410414557.X, filed on Aug. 20, 2014, both of which are hereby incorporated by reference in its entireties.

TECHNICAL FIELD

The present disclosure relates to semiconductor packaging technology applied in a capacitive type fingerprint recognition apparatus, and in particular, to a chip packaging module based on a capacitive type fingerprint recognition chip.

BACKGROUND

Fingerprint recognition apparatuses have been gradually applied to various terminal devices, such as a mobile terminal, a bank system, and an attendance system. The most common fingerprint recognition apparatus generally includes a basic sensing circuit, a control circuit, and a storage circuit, and interconnection between these circuits is generally classified into intra-chip interconnection or inter-chip interconnection. If a conventional wire bonding packaging process is used, a pad on a surface of a fingerprint recognition chip must have an arc height for wire bonding. With the existence of the arc height, a human finger cannot make contact with the recognition sensor area of the fingerprint recognition chip. Otherwise, a bonded wire may be damaged.

SUMMARY

In an embodiment of the present disclosure, a chip packaging module includes: a first chip, where a first pad is disposed on a side neighboring to a front surface of the first chip; at least one second chip, where the at least one second chip is disposed on a rear side of the first chip, each second chip has a second pad, and the first pad of the first chip is connected to the second pad of the second chip by using a redistribution layer.

BRIEF DESCRIPTION OF THE DRAWINGS

The foregoing and/or additional aspects and advantages of the present disclosure become clear and are easy to understand according to the embodiments described with reference to the following accompanying drawings.

REFERENCE NUMERALS

11: first chip; 12: front surface; 13: rear surface; 15: first pad;
14: fingerprint recognition sensor area; 16: redistribution layer; 17: second pad; 18: planarization medium layer;
19: second chip; 31: through silicon via; 32: protrusion; 21: groove;
41: bonded wire; 9: substrate; 91: substrate pad.

DETAILED DESCRIPTION

Embodiments of the present disclosure are described below in detail, examples of the embodiments are shown in accompanying drawings, and reference signs that are the same or similar from beginning to end represent the same or similar components or components that have the same or similar functions. The embodiments described below with reference to the accompanying drawings are exemplary, are merely used to explain the present disclosure, and cannot be construed as a limit to the present disclosure.

In descriptions of the present disclosure, it should be understood that, direction or position relationships indicated by terms "central", "transverse", "length", "width", "thickness", "above", "below", "front", "behind", "vertical", "horizontal", "top", "bottom", "internal", and "external" are direction or position relationships shown based on the accompanying drawings, are merely used to conveniently describe the present disclosure and simplify the descriptions, and are not used to indicate or imply that the indicated apparatus or component must have a specific direction and are constructed and operated in a specific direction. Therefore, the terms cannot be construed as a limit to the present disclosure.

In addition, terms "first" and "second" are merely used to describe an objective, and cannot be construed as indicating or implying relative importance or implicitly indicating a quantity of indicated technical features. Therefore, features that are limited by using "first" and "second" can expressly indicate or implicitly include one or more of the features. In the descriptions of the present disclosure, unless otherwise noted, "more" means two or more than two.

In the descriptions of the present disclosure, it should be noted that, unless otherwise expressly specified and limited, terms "installation", "connect", and "connection" should be understood in a generalized manner. For example, the terms may be fixed connection, detachable connection, or integrated connection; may be direct connection, indirect connection by using a medium, or connectivity in two components. A person of ordinary skill in this field can understand specific meanings of the foregoing terms in the present disclosure according to specific cases.

A chip packaging module in the embodiments of the present disclosure is described below with reference to FIG. 1 to FIG. 7.

Figure 1:
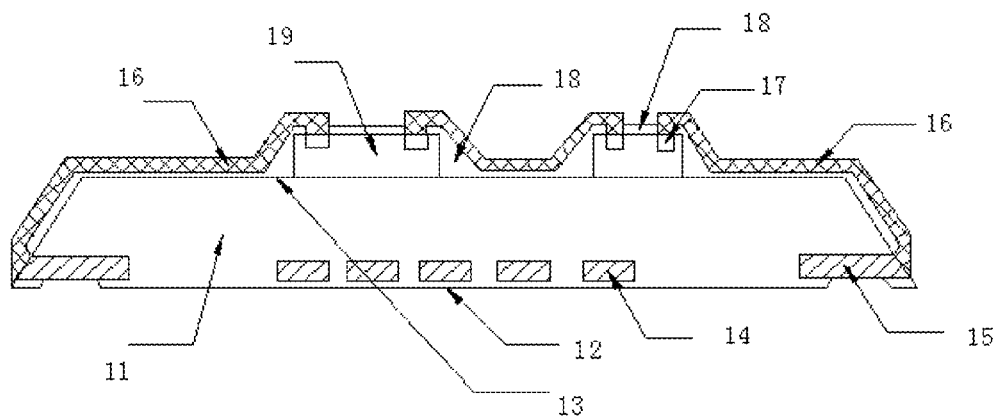
FIG. 1 is a sectional view of a chip packaging module according to a first embodiment of the present disclosure.

As shown in FIG. 1, the chip packaging module in an embodiment of the present disclosure includes a first chip 11 and at least a second chip 19. Biometric recognition may be directly performed on a fingerprint recognition sensor area 14.

Referring to FIG. 1, a matrix formed by sensor signal receiving terminals and a first pad 15 are disposed on a side of the first chip 11 neighboring to a front surface 12, where the first pad 15 has an external signal interconnection function and is neighboring to the matrix. In other words, a distance between the first pad 15 and the front surface 12 of the first chip 11 is shorter than a distance between the first pad 15 and a rear surface 13 of the first chip 11. The first chip 11 may be a silicon chip. It can be understood by the skilled person that a quantity of first pads 15 may be specifically set as desired, which is not specifically limited in the present disclosure.

At least a part of a front surface of the first pad 15 is exposed from the front surface 12 of the first chip 11, as shown in FIG. 1, FIG. 3, and FIG. 4 to FIG. 6. In other words, with a perspective from front to back, only a part of the front surface of the first pad 15 can be seen. Certainly, the front surface of the first pad 15 may alternatively be completely exposed from the front surface 12 of the first chip 11, and in this case, the entire front surface of the first pad 15 can be seen.

At least one second chip 19 is disposed on a rear side of the first chip 11. For example, the second chip 19 may be disposed on a rear surface of the first chip 11, as shown in FIG. 1 to FIG. 6. Certainly, when a substrate 9 is disposed on the rear surface of the first chip 11, the second chip 19 may also be disposed on the substrate 9, and in this case the second chip 19 is located behind the first chip 11.

The first pad 15 of the first chip 11 is connected to a second pad 17 of the second chip 19 via a redistribution layer 16. The redistribution layer refers to a metal layer that repositions the first pad 15 of the first chip 11, and the obtained position after the repositioning and the first pad 15 are on different surfaces.

Specifically, the redistribution layer 16 extends from the front surface 12 of the first chip 11 to the rear surface 13 of the first chip 11. In other words, the redistribution layer 16 extends along a front-to-back direction; a first end (for example, a front end in FIG. 1) of the redistribution layer 16 is connected to the first pad 15, and a second end (for example, a back end in FIG. 1) of the redistribution layer is suitable to be connected to the second pad 17 of the second chip 19. The redistribution layer 16 may be formed by such processes as metal deposition, photolithography and etching etc.

In one example, one with a larger area may be selected from two chips as the first chip 11. In other words, an area of the first chip 11 is larger than the area of the second chip 19. The first chip is a fingerprint recognition chip, and the second chip 19 may be a main control chip or another secondary chip.

Preferably, there are two second chips 19, and the two second chips 19 are both disposed on the rear surface 13 of the first chip 11. Second pads 17 of the two second chips 19 may be connected via the redistribution layer 16, or may be connected via a bonded wire 41. A manner for connecting each second chip 19 to the first chip 11 is already described above in detail, and is not described herein again.

According to the chip packaging module in these embodiments of the present disclosure, a second chip 19 is disposed on a rear side of a first chip 11, and a first pad 15 is connected to a second pad 17 by using the redistribution layer 16. By means of a redistribution technology on surfaces of multiple chips, an interconnection wires are disposed on a rear surface 13 of the first chip 11, so that a fingerprint recognition sensor area 14 on the front surface 12 of the first chip 11 can be directly contacted with human body. A communication distance between chips is greatly reduced, and efficiency of communication between chips is improved.

According to the first embodiment of the present disclosure, with reference to FIG. 1, the first pad 15 is disposed neighboring to the front surface 12 of the first chip 11, and is exposed from a side surface of the first chip 11. One end of the redistribution layer 16 is connected to the first pad 15 from the side surface of the first chip 11. As shown in FIG. 1, the first pad 15 may be seen from the side surface of the first chip 11. The first pad 15 is preferably on a same level with the side surface of the first chip 11. One end of the redistribution layer 16 is connected to a position that corresponds to the first pad 15 and is on the side surface of the first chip 11. The redistribution layer 16 extends backwards along the side surface of the first chip 11 to the rear surface 13 of the first chip 11, and is connected to the second pad 17 of the second chip 19 on the rear surface 13 of the first chip 11.

The side surface of the first chip 11 is shaped into a slope that inclines from front to back and extends inwards, and the redistribution layer extends along the slope in a front-to-back direction. In other words, the redistribution layer 16 performs interconnection wiring along the slope, so as to lay out the redistribution layer 16.

Figure 2:
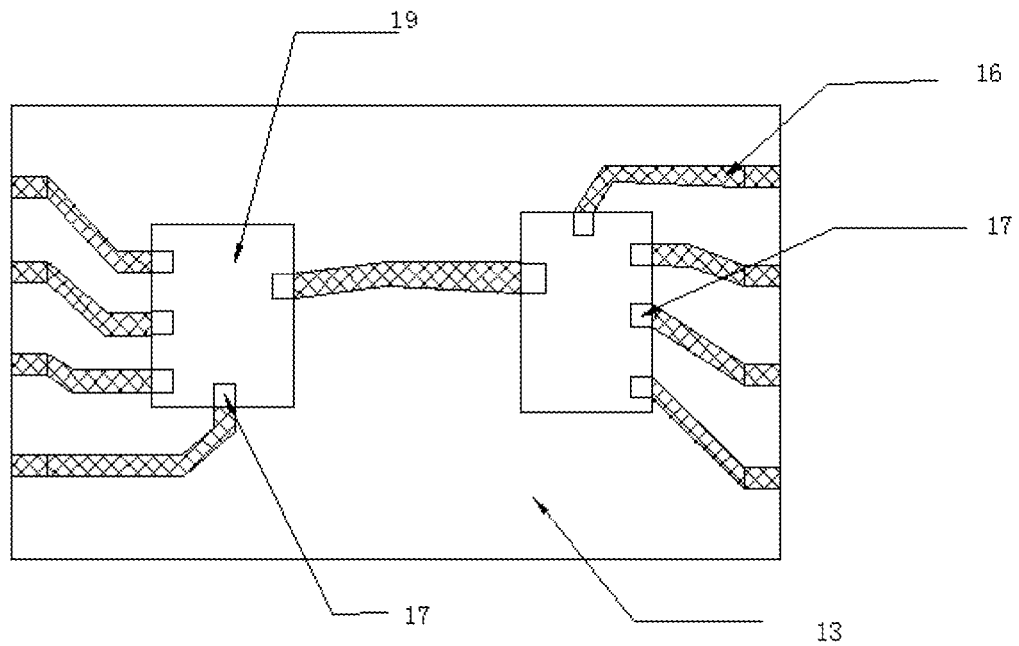
FIG. 2 is a top view of the chip packaging module shown in FIG. 1.

FIG. 2 is a top view of the chip packaging module shown in FIG. 1. A quantity of redistribution layers 16 is not limited, and is depends on a design of a chip pad. The redistribution layer 16 is led from the front surface 12 of the first chip 11 to the rear surface 13, as shown on a plane in FIG. 2. The redistribution layer 16 is interconnected to the second pad 17 of the second chip 19 on the rear surface 13.

Figure 3:
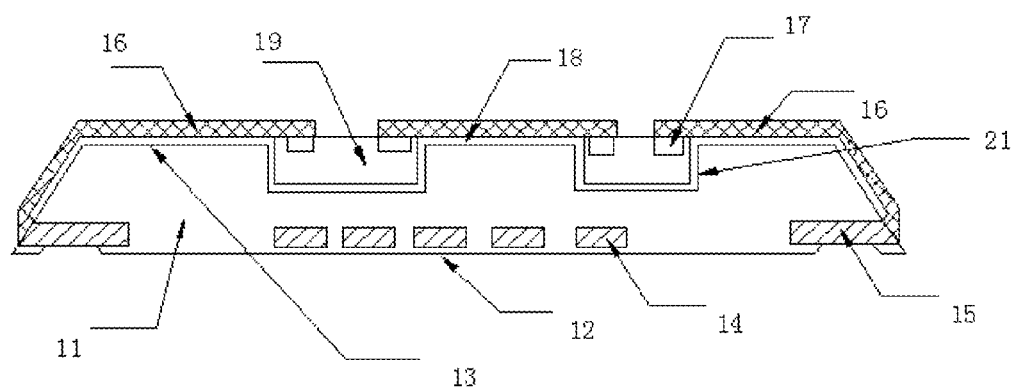
FIG. 3 is a sectional view of a chip packaging module according to a second embodiment of the present disclosure.

According to a second optional embodiment of the present disclosure, as shown in FIG. 3, a groove 21 (that is, a groove) is formed on the rear surface 13 of the first chip 11, an inner surface of the groove 21 is coated with an insulation layer, the rear surface 13 of the first chip 11 is coated with a planarization medium layer 18, the second chip 19 is placed in the groove 21, and the rear surface of the second chip 19 contacts with a bottom wall of the groove 21. The insulation layer may be a planarization medium layer 18, and in this case, the planarization medium layer 18 may be used as an insulation layer. Optionally, the planarization medium layer 18 is an organic resin layer or an inorganic silicide layer.

A front surface of the second chip 19 is preferably on a same horizontal plane as the rear surface 13 of the first chip 11, and then, the first pad 15 of the first chip 11 is connected to the second pad 17 of the second chip 19 by using the redistribution layer 16. Before redistribution for performing interconnection between the second pad 17 of the second chip 19 and the first pad 15 of the first chip 11, a surface planarization medium layer 18 should be included.

Figure 4:
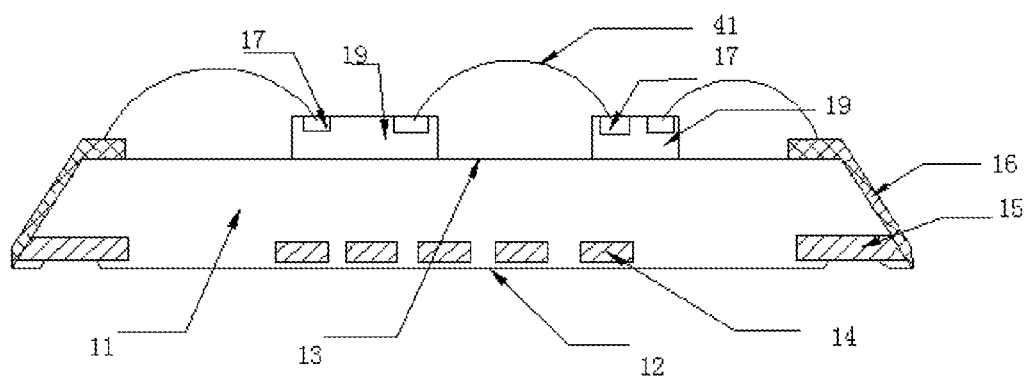
FIG. 4 is a sectional view of a chip packaging module according to a third embodiment of the present disclosure.

According to a third optional embodiment of the present disclosure, as shown in FIG. 4, in this solution, the first pad 15 of the first chip 11 is connected to the rear surface 13 of the first chip by using the redistribution layer 16, and the second pad 17 of the second chip 19 is mutually connected to the redistribution layer 16 by using a bonded wire 41. A special point of this solution is not to use a planarization medium layer 18.

Figure 5:
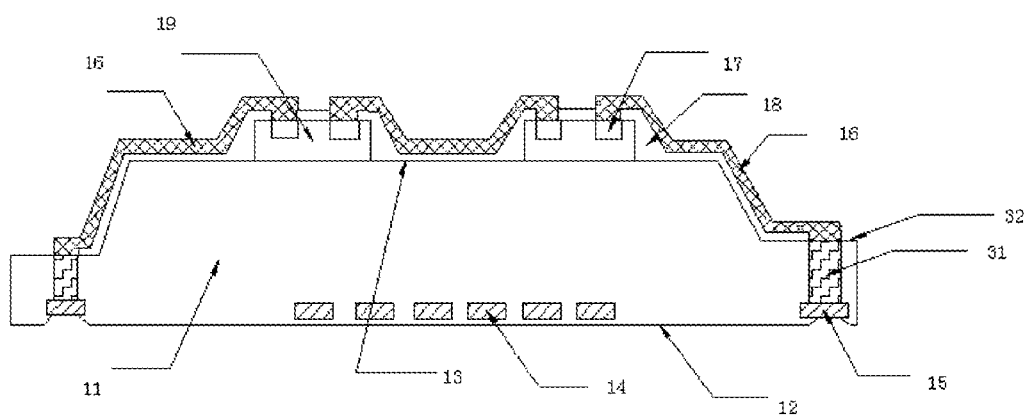
FIG. 5 is a sectional view of a chip packaging module according to a fourth embodiment of the present disclosure.

FIG. 5 shows a fourth optional embodiment of this solution. Specifically, a front portion of the side surface of the first chip 11 has a protrusion 32 protruding outwards, the first pad 15 is disposed in the protrusion 32, a through silicon via is formed between the rear surface of the first pad 15 and the rear surface 13 of the first chip 11. For example, a part of the front surface of the first pad 15 is exposed from the front surface 12 of the first chip 11, and the through silicon via 31 is formed on a rear surface of the protrusion 32. The through silicon via 31 is internally filled with metal conductive material, and one end of the redistribution layer 16 covers the through silicon via 31 to connect to the first pad 15.

Referring to FIG. 3 and FIG. 4, the metal conductive material may be copper and the like, and the redistribution layer 16 covers the rear surface of the protrusion 32 at a region corresponding to the through silicon via 31, so as to be connected to the first pad 15 by using the metal conductive material.

A manner of processing a trapezoid protrusion structure of the first chip 11 includes two types: physical etching and chemical etching.

Figure 6:
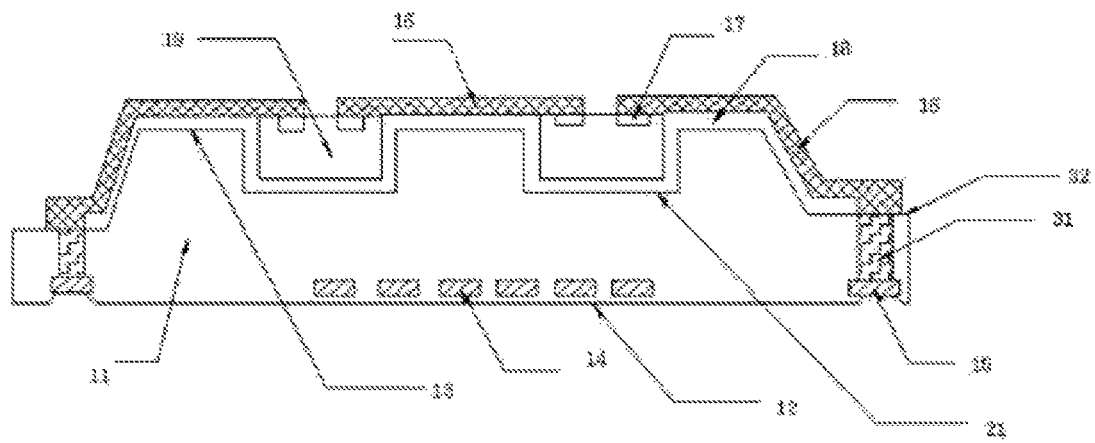
FIG. 6 is a sectional view of a chip packaging module according to a fifth embodiment of the present disclosure.

FIG. 6 shows a fifth optional embodiment of the present disclosure. Similarly, FIG. 6 uses a same protrusion structure as FIG. 5. Similarly, the rear surface 13 of the first chip 11 has a groove 21, and a manner for forming the groove 21 includes two types: physical etching and chemical etching. A surface of the groove 21 is coated with a planarization medium layer 18, the second chip 19 is placed in the groove 21, a surface of the second chip 19 is on a same plane as the rear surface 13 of the first chip 11, and the second chip 19 is mutually connected to the first chip 11 on the plane by using the redistribution layer 16.

Figure 7:
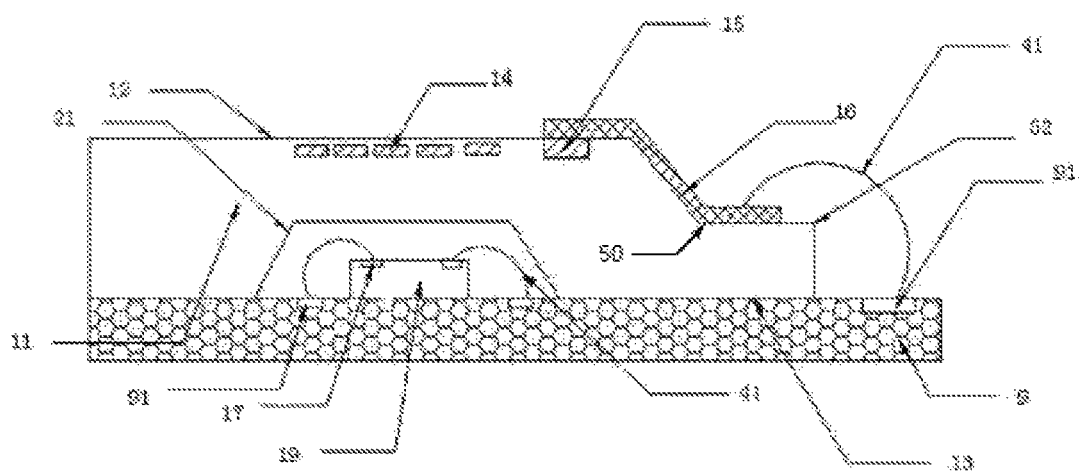
FIG. 7 is a sectional view of a chip packaging module according to a sixth embodiment of the present disclosure.

FIG. 7 is a sixth optional embodiment of the present disclosure. This embodiment is different from the foregoing solution. A first recess portion is formed in a front surface 12 of the first chip 11, and one end of the redistribution layer 16 extends to a bottom wall of the first recess portion. Specifically, a protrusion 32 is formed through processing on one side of the first pad 15 of the front surface 12 of the first chip 11, one end of the redistribution layer 16 is connected to the first pad 15, and the other end is connected to the protrusion 32 through wiring. Similarly, a groove 21 is formed on the rear surface 13 of the first chip 11, and a shape of the groove may be trapezoid or square. Optionally, the groove 21 is formed by using a method, such as physical cutting, dry etching, or chemical corrosion and etching.

A substrate 9 is used as a carrier of this solution, the substrate 9 is generally a printed circuit board (PCB) or a soft/hard plate, a substrate pad 91 is printed on a surface of the substrate 9, substrate pads 91 in different positions are mutually connected in advance by using printed wires in the substrates 91, and an interconnection relationship depends on a circuit function. The substrate pad 91 is mutually connected to one end of the redistribution layer 16 of the first chip 11 by using a bonded wire 41. Similarly, the second pad 17 of the second chip 19 is also mutually connected to the substrate pad 91 by using the bonded wire 41.

According to the chip packaging module in these embodiments of the present disclosure, redistribution and interconnection is performed by using the space of the rear surface 13 of the first chip 11. Consequently, chip packaging efficiency can be improved, a failure rate is reduced and costs are greatly reduced.

In the descriptions of the specification, descriptions with reference to terms "one embodiment", "some embodiments", "exemplary embodiment", "example", "specific example", and "some examples" refers to that specific features, structures, materials, or characteristics described with reference to the embodiments or examples are included in at least one embodiment or example of the present disclosure. In this specification, exemplary expressions of the foregoing terms do not necessarily refer to a same embodiments or examples. Moreover, the described specific features, structures, materials, or characteristics may be combined in a proper manner in any one or more embodiments or examples.

Although the embodiments of the present disclosure has been shown and described, a person of ordinary skill in the prior art may understand that: changes, modifications, replacements, and variations can be made to the embodiments, as long as such changes, modifications, replacements, and variations do not depart from the principle and purpose of the present disclosure. The scope of the present disclosure is limited by the claims and equivalents of the claims.

INDUSTRIAL APPLICABILITY

According to the chip packaging module in the embodiments of the present disclosure, a second chip is disposed on a rear side of a first chip, and a first pad is connected to a second pad by using a redistribution layer. By means of a redistribution technology on surfaces of multiple chips, an interconnection wire is disposed on a back surface of the first chip, so that a fingerprint recognition sensor area on the front surface of the first chip can directly contact with human body. A communication distance between chips is greatly reduced, and efficiency of communication between chips is improved.

What is claimed is:

1. A chip packaging module, comprising:
   a first chip, wherein a first pad is disposed on a side neighboring to a front surface of the first chip; and
   at least a second chip, wherein at least one second chip is disposed on a rear side of the first chip, each second chip has a second pad, and wherein the first pad of the first chip is connected to the second pad of the second chip via a redistribution layer;
   wherein a first recess portion is formed on the front surface of the first chip, and an end of the redistribution layer extends to a bottom wall of the first recess portion.

2. The chip packaging module according to claim 1, wherein a second recess portion that recesses forward is formed on a rear surface of the first chip, and the second chip is disposed in the second recess portion.

3. The chip packaging module according to claim 2, wherein the first chip is a fingerprint recognition chip.

4. The chip packaging module according to claim 1, wherein a rear surface of the first chip is provided with a planarization medium layer.

5. The chip packaging module according to claim 4, wherein the planarization medium layer is an organic resin layer or an inorganic silicide layer.

6. The chip packaging module according to claim 1, wherein the first pad is disposed neighboring to the front surface of the first chip, or is exposed from the front surface of the first chip.

7. The chip packaging module according to claim 1, wherein the redistribution layer is directly connected to the first pad.

8. The chip packaging module according to claim 1, wherein a side surface of the first chip is shaped into a slope that inclines from front to back, and wherein the redistribution layer extends along the slope in a front-to-back direction.

9. The chip packaging module according to claim 1, wherein a rear surface of the first chip is provided with a groove, and an inner wall of the groove has an insulation layer, wherein at least one second chip is disposed in the groove, and a rear surface of the second chip contacts with a bottom wall of the groove.

* * * * *